United States Patent
Satoh

(10) Patent No.: US 9,034,153 B2
(45) Date of Patent: May 19, 2015

(54) NONMAGNETIC MATERIAL PARTICLE DISPERSED FERROMAGNETIC MATERIAL SPUTTERING TARGET

(75) Inventor: Kazuyuki Satoh, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1178 days.

(21) Appl. No.: 12/160,042

(22) PCT Filed: Dec. 26, 2006

(86) PCT No.: PCT/JP2006/325883
§ 371 (c)(1),
(2), (4) Date: Jul. 3, 2008

(87) PCT Pub. No.: WO2007/080781
PCT Pub. Date: Jul. 19, 2007

(65) Prior Publication Data
US 2009/0242393 A1    Oct. 1, 2009

(30) Foreign Application Priority Data
Jan. 13, 2006  (JP) .................... 2006-006575

(51) Int. Cl.
*C23C 14/34*  (2006.01)
*G11B 5/851*  (2006.01)
*H01F 41/18*  (2006.01)

(52) U.S. Cl.
CPC ............ *G11B 5/851* (2013.01); *C23C 14/3414* (2013.01); *H01F 41/183* (2013.01)

(58) Field of Classification Search
USPC ................................... 204/298.13
See application file for complete search history.

(56) References Cited

U.S. PATENT DOCUMENTS 5,679,473 A * 10/1997 Murayama et al. ........ 428/836.3
6,716,542 B2   4/2004 Uwazumi et al.

(Continued)

FOREIGN PATENT DOCUMENTS

JP   04066664 A   *   3/1992
JP   07111221 A   *   4/1995

(Continued)

OTHER PUBLICATIONS

Machine Translation to Ueno (JP 2005-320627) published Nov. 2005.*

(Continued)

*Primary Examiner* — John Brayton
(74) *Attorney, Agent, or Firm* — Howson & Howson LLP

(57) ABSTRACT

Provided is a nonmagnetic material particle dispersed ferromagnetic material sputtering target comprising a material including nonmagnetic material particles dispersed in a ferromagnetic material. The nonmagnetic material particle dispersed ferromagnetic material sputtering target is characterized in that all particles of the nonmagnetic material with a structure observed on the material in its polished face have a shape and size that are smaller than all imaginary circles having a radius of 2 μm formed around an arbitrary point within the nonmagnetic material particles, or that have at least two contact points or intersection points between the imaginary circles and the interface of the ferromagnetic material and the nonmagnetic material. The nonmagnetic material particle dispersed ferromagnetic material sputtering target is advantageous in that, in the formation of a film by sputtering, the influence of heating or the like on a substrate can be reduced, high-speed deposition by DC sputtering is possible, the film thickness can be regulated to be thin, the generation of particles (dust) or nodules can be reduced during sputtering, the variation in quality can be reduced to improve the mass productivity, fine crystal grains and high density can be realized, and the nonmagnetic material particle dispersed ferromagnetic material sputtering target is particularly best suited for use as a magnetic recording layer.

17 Claims, 4 Drawing Sheets

(56) References Cited

U.S. PATENT DOCUMENTS

| | | |
|---|---|---|
| 7,141,208 B2 | 11/2006 | Ueno et al. |
| 8,568,576 B2 | 10/2013 | Sato |
| 2010/0320084 A1 | 12/2010 | Sato |
| 2013/0001079 A1 | 1/2013 | Sato |
| 2013/0015061 A1 | 1/2013 | Sato |

FOREIGN PATENT DOCUMENTS

| | | | |
|---|---|---|---|
| JP | H08-109470 A | | 4/1996 |
| JP | H10-088333 A | | 4/1998 |
| JP | H10-158825 A | | 6/1998 |
| JP | 2000-096220 A | | 4/2000 |
| JP | 2001-098360 A | | 4/2001 |
| JP | 2004339586 A | * | 12/2004 |
| JP | 2005-097657 A | | 4/2005 |
| JP | 2005320627 A | * | 11/2005 |
| JP | 2006-045587 A | | 2/2006 |
| JP | 2006-176810 A | | 7/2006 |

OTHER PUBLICATIONS

Machine Translation to Ishigami (JP 07-111221A) published Oct. 1993.*

Machine Translation to Mori (JP 2004339586 A) published Dec. 2004.* esp@cenet database, One Page English Abstract of JP 10-088333 A1, Apr. 7, 1998.

esp@cenet database, One Page English Abstract of JP 2001-098360 A1, Apr. 10, 2001.

esp@cenet database, One Page English Abstract of JP 2004-339586 A1, Dec. 2, 2004.

esp@cenet database, One Page English Abstract of JP 2000-096220 A1, Apr. 4, 2000.

* cited by examiner

NONMAGNETIC MATERIAL PARTICLE DISPERSED FERROMAGNETIC MATERIAL SPUTTERING TARGET

BACKGROUND OF THE INVENTION

The present invention relates to a nonmagnetic material particle dispersed ferromagnetic material sputtering target, and in particular relates to a nonmagnetic material particle dispersed ferromagnetic material sputtering target which realizes, in the formation of a film by sputtering, stable direct current (DC) sputtering and optimal deposition speed, minimal arcing during the sputtering, reduction in the particles (dust) and nodules caused by such arcing, high density, minimal variation in quality, and improvement of mass productivity.

In the field of magnetic recording, technology has been developed for improving the magnetic property by causing a nonmagnetic material to coexist in a magnetic body thin film. Some of the examples are technology for improving the soft magnetic property such as magnetic permeability by causing fine particles of the nonmagnetic material to exist in the magnetic material thin film, and technology for improving various properties as a magnetic recording medium such as coercitivity by using the nonmagnetic material to block or weaken the magnetic interaction between the fine metallic particles in the magnetic body thin film material.

Although this kind of thin film material is prepared based on normal sputtering, it is necessary to simultaneously sputter nonmagnetic materials with insulation property or high resistance and ferromagnetic materials with low resistance or composed from metals.

This sputtering method makes a positive electrode substrate and a negative electrode target face each other, and generates an electric field by applying high voltage or radio frequency between the substrate and the target under an inert gas atmosphere.

Here, the sputtering method employs a fundamental principle where inert gas is ionized, plasma formed from electrons and positive ions is formed, and the positive ions in this plasma collide with the target (negative electrode) surface. The extruded atoms adhere to the opposing substrate surface, wherein the film is formed.

As the general sputtering method, the RF (radio frequency) sputtering method or the DC (direct current) sputtering method may be used. However, in order to sputter materials with significantly different resistance simultaneously, the RF sputtering method that is capable of sputtering an insulator is often used.

Nevertheless, not only is the RF (radio frequency) sputtering device expensive, it possesses numerous drawbacks such as inferior sputtering efficiency, large power consumption, complex control and slow deposition speed. If high power is applied to increase the deposition speed, the substrate temperature will rise, and there is a problem in that this will cause deterioration in the substrate and deposition material.

Meanwhile, since the DC sputtering method has low power consumption, is capable of high speed deposition and is inexpensive in comparison to the RF sputtering method, it is superior in mass productivity. In addition, it is generally said that the DC sputtering method is able to produce high-quality films since the influence of the plasma on the substrate is small.

Accordingly, a sputtering target for simultaneous sputtering a nonmagnetic material and a ferromagnetic material is also devised so that it can be used in DC sputtering as much as possible. When adopting the DC sputtering method, the target itself needs to possess conductive property.

Even if the target possesses conductive property, if such target contains large amounts of nonconductive property material such as oxides and silicides, deposition based on DC sputtering will become difficult since the bulk resistance of the target will increase.

Thus, a sputtering target has been devised to have a structure in which a nonmagnetic material such as oxides is finely and spherically dispersed therein. Nevertheless, even with this kind of devisal, there is a problem in that large amounts of particles are generated.

Some background art are introduced below. As one example, proposed is a method of performing mechanical ironing to alloy powder having an alloy phase prepared with the rapid solidification method, and ceramic phase powder (refer to Patent Document 1). According to this methods it is possible to obtain a sputtering target for use in a magnetic recording medium by preparing alloy powder in which ceramic phase powder is evenly dispersed in the alloy powder, and thereafter molding this by way of hot pressing.

As another example, proposed is Co-based alloy containing a silica phase in which the average width there sought with the line segment method is in the range of 0.5 to 5 µm, as well as Cr and Pt phases (refer to Patent Document 2). The silica powder in this case is obtained with a special method of high temperature flame hydrolysis deposition.

Nevertheless, with respect to the materials obtained with the foregoing methods, in the case of the former (first example), the object is simply forming the particles uniformly as much as possible, and in the case of the latter (second example), although a target structure distributed in a web shape is obtained, the existence of coarse grains can be observed in certain locations. Based on these types of methods, it is assumed that particles will increase enormously upon forming a film based on sputtering as described later, which will be unfit as a target material.

[Patent Document 1] Japanese Patent Laid-Open Publication No. H10-88333
[Patent Document 2] Japanese Patent Laid-Open Publication No. 2004-339586

SUMMARY OF THE INVENTION

In light of the above, an object of the present invention is to provide a high density nonmagnetic material particle dispersed ferromagnetic material sputtering target, in particular a sputtering target optimal for use as a magnetic recording layer which realizes, in the formation of a film by sputtering, high-speed deposition based on DC sputtering, reduction in the particles (dust) and nodules generated during the sputtering, minimal variation in quality, improvement of mass productivity and fine crystal grains.

In order to achieve the foregoing object, as a result of intense study, the present inventors discovered that as a result of regulating the mode of dispersing the nonmagnetic material particles and providing conductive property, it is possible to perform DC sputtering, improve the density, and considerably reduce the particles and nodules generated during the sputtering.

Based on the foregoing discovery, the present invention provides a nonmagnetic material particle dispersed ferromagnetic material sputtering target, wherein, in a material including nonmagnetic material particles dispersed in a ferromagnetic material, all particles of the nonmagnetic material with a structure observed on the material in its polished face have a shape and size that are smaller than all imaginary circles having a radius of 2 μm formed around an arbitrary point within the nonmagnetic material particles, or alternatively a shape and size with at least two contact points or intersection points between the imaginary circles and the interface of the ferromagnetic material and the nonmagnetic material.

Specifically, an imaginary circle with a radius of 2 μm having its center an at arbitrary point in the nonmagnetic material particles does not even have one location of a contact point or an intersection point with the interface, and coarse particles that are contained in nonmagnetic material particles are not included in the present invention.

As long as the foregoing conditions are satisfied, there is no particular limitation on the shape and size of the nonmagnetic material particles. For example, even in modes of thread shapes having a length of 2 μm or longer or finely branched shapes, the object of the present invention can be achieved so as long as the foregoing conditions are satisfied.

In the case of spherical shapes, the diameter will be 4.0 μm or less. These kinds of fine particles will hardly influence the generation of particles.

The nonmagnetic material particles dispersed in the ferromagnetic material do not necessarily have to be spherical. Rather, it could be said that thread-shaped, starfish-shaped or web-shaped particles are more preferable than spherical particles. Because the large spherical grains observed in the polished face easily cause grain separation, and the generation of particles is strongly affected by the occurrence of grain separation.

The thread-shaped or starfish-shaped or web-shaped structure observed in the polishing of the surface also exists in the thickness direction of the target as a matter of course. Like this, the thread-shaped or starfish-shaped or web-shaped structure bonded in the thickness direction of the target will hardly cause grain separation. Increase in the contact area of the ferromagnetic material and the nonmagnetic material such as oxides is effective in preventing grain separation. Thus, it could be said that the width of the thread-shape or web-shape is preferably small and dispersed.

The condition of the present invention in which the shape and size are smaller than all imaginary circles having a radius of 1 μm formed around an arbitrary point within the nonmagnetic material particles, or alternatively the shape and size have at least two contact points or intersection points between the imaginary circles and the interface of the ferromagnetic material and the nonmagnetic material covers the foregoing thread-shaped or starfish-shaped or web-shaped structure.

With the nonmagnetic material particle dispersed ferromagnetic material sputtering target of the present invention, preferably, the shape and size are smaller than all imaginary circles having a radius of 1 μm formed around an arbitrary point within the nonmagnetic material particles, or alternatively the shape and size have at least two contact points or intersection points between the imaginary circles and the interface of the ferromagnetic material and the nonmagnetic material. This is for seeking an even finer structure.

A sputtering target of the present invention made of a ferromagnetic material containing a dispersion of particles of a nonmagnetic material preferably has, in a microstructure observed on a polished face of the sputtering target, areas of a ferromagnetic material phase in which the nonmagnetic material phase do not exist, a largest diameter of diameters of said areas being 40 μm or less, and a number of said areas having a diameter of 10 μm or greater being 1000 areas/mm$^2$ or less. This recited feature of the microstructure of the target means that, the ferromagnetic material is desirably not to be concentrated in only a certain area of the target microstructure in order to obtain a uniform dispersion of the nonmagnetic material in the target microstructure.

The nonmagnetic material particle dispersed ferromagnetic material sputtering target is particularly effective as a ferromagnetic material having Co and/or Fe as its main component. The nonmagnetic material particle dispersed ferromagnetic material sputtering target of the present invention is also effective as a nonmagnetic material including one or more components selected from oxide, nitride, carbide, and silicide. Nevertheless, desirably, the nonmagnetic material is composed from metallic oxide which does not reduce or dissolve even when ignited in a vacuum or inert atmosphere in a status of coexisting with the component of the ferromagnetic material. This is to prevent the influence on the composition of the ferromagnetic material due to the reduction or dissolution during the preparation of the target.

The nonmagnetic material particle dispersed ferromagnetic material sputtering target of the present invention is able to realize a relative density of 97% or higher, and even a relative density of 98% or higher. The relative density is 97% or higher or the relative density is 98% or higher in relation to the calculated density derived from the following formula. Since the target density depends on the alloy composition, it is difficult to calculate the precise density, however, by using the calculated density of the following formula (Formula 1) as a reference, it is possible to applying for changes of a fine structure.

Calculated Density=Σmolecular weight×molar ratio/ (molecular weight×molar ratio/density)     [Formula 1]

As described above, the regulated target yields a superior effect of being able to be used in DC sputtering, and, in comparison to RF sputtering, DC sputtering has fast deposition speed and favorable sputtering efficiency. In addition, a DC sputtering device is advantageous in that it is inexpensive, easy to control, and has low power consumption.

Therefore, by using the sputtering target of the present invention, it is possible to obtain a high-quality material, and in particular a superior effect is yielded in that a magnetic material can be manufactured stably and at low cost. Moreover, densification of the sputtering target of the present invention will increase the adhesion of the nonmagnetic material and the ferromagnetic material, inhibit the grain separation of the nonmagnetic material, reduce pores and refine the crystal grains, and achieve a uniform and smooth sputtered target face. Thus, the present invention yields a superior effect of reducing the particles and nodules during sputtering and prolonging the target life.

DETAILED DESCRIPTION OF THE INVENTION

Figure 1:
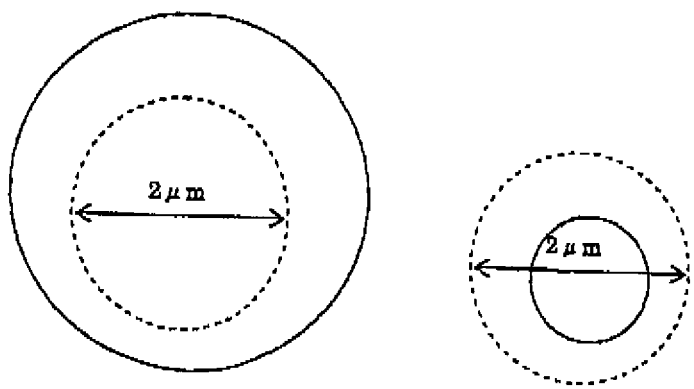
FIG. 1 is a view showing a frame format of spherical particles.

Upon manufacturing the nonmagnetic material particle dispersed ferromagnetic material sputtering target of the present invention, fine powder of 1 to 5 μm of a material having Co and/or Fe as its main component is used as the ferromagnetic material, and one or more types of materials selected from oxide, nitride, carbide, and silicide are used as the nonmagnetic material. The foregoing fine powder of 1 to 5 μm is mixed in a ball mill or the like for roughly 20 to 100 hours, and thereafter sintered with the HP (hot press) method at a temperature of 1000 to 1250° C.

Although the shape and size of all particles of the nonmagnetic material with a structure observed on the polished face of the sintered compact in which nonmagnetic material particles are dispersed in the ferromagnetic material can be adjusted according to the shape of the raw material powder, time spent on mixing, and the sintering temperature, these conditions can be arbitrarily selected from the foregoing scope of conditions in consideration that the size of the particles can also be increased depending on the combination of the ferromagnetic material and the nonmagnetic material.

The selection of the manufacturing conditions comprises a shape and size that are smaller than all imaginary circles having a radius of 1 μm formed around an arbitrary point within the nonmagnetic material particles, or alternatively a shape and size with at least two contact points or intersection points between the imaginary circles and the interface of the ferromagnetic material and the nonmagnetic material. In other words, the shape and size of the particles need to satisfy the foregoing conditions. It could be said that the particles satisfying the foregoing conditions are often fine spherical particles or fine thread-shaped or starfish-shaped or web-shaped particles.

Atomized powder may also be used as the magnetic material. In addition to using raw material powder of the magnetic material particles, alloy powder may also be used. Pulverization and mixing may also be performed using mechanical ironing in addition to employing mechanical ironing. For sintering, besides the hot press method, the plasma discharge sintering method or hot isostatic pressing may also be used.

In any case, the condition of the present invention is that in a material including nonmagnetic material particles dispersed in a ferromagnetic material, all particles of the nonmagnetic material with a structure observed on the material in its polished face have a shape and size that are smaller than all imaginary circles having a radius of 2 μm formed around an arbitrary point within the nonmagnetic material particles, or alternatively a shape and size with at least two contact points or intersection points between the imaginary circles and the interface of the ferromagnetic material and the nonmagnetic material, and the shape and size may arbitrarily be selected so as long as they satisfy the foregoing condition.

The following is a specific example of all particles of the nonmagnetic material with a structure observed on the material in its polished face having a shape and size that are smaller than all imaginary circles having a radius of 2 μm formed around an arbitrary point within the nonmagnetic material particles, or alternatively a shape and size with at least two contact points or intersection points between the imaginary circles and the interface of the ferromagnetic material and the nonmagnetic material.

For example, in the case of spherical nonmagnetic material particles, FIG. 1 is a view showing a frame format of a case where an imaginary circle having a radius of 1 μm is included in the particles at the left side of FIG. 1, and these coarse particles do not correspond to the present invention. The right side of FIG. 1 shows a case of small particles where the radius of the particles is 2.0 μm or less and smaller than the imaginary circle having a radius of 2 μm.

These fine particles will not cause any particular problem concerning the generation of particles of the target, and it is also possible to obtain a high density target.

Figure 2:
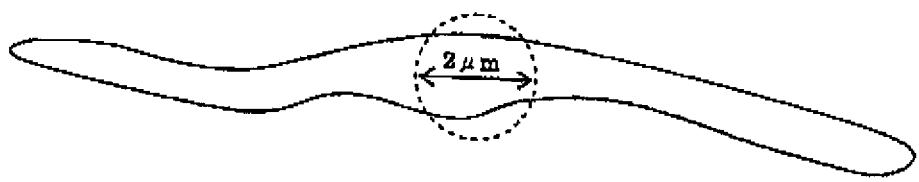
FIG. 2 is a view showing a frame format of thread-shaped particles.

In the case of thread-shaped nonmagnetic material particles, FIG. 2 is a view showing a frame format of such an example. There is no particular limitation on the length or curve as long as it is within the imaginary circuit having a radius of 2 μm or less from an arbitrary point in the cross section of the nonmagnetic material particles. Thin thread-shaped particles follow the object of the present invention, and will not cause any particular problem.

Figure 3:
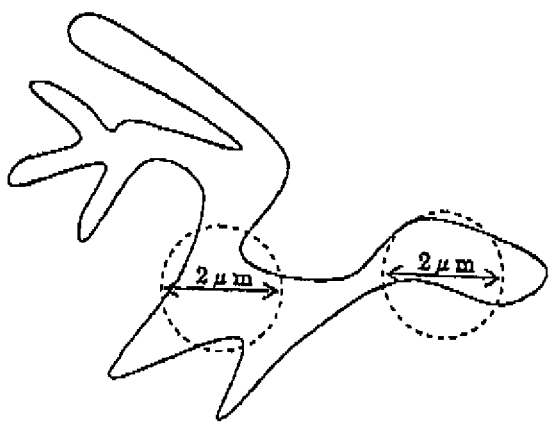
FIG. 3 is a view showing a frame format of web-shaped particles.

FIG. 3 is a view showing a frame format of the web-shaped particles. In principle, these particles are the same as the foregoing thin thread-shaped particles. In this case, although there are cases where the nodes of the web will become coarse and exceed the imaginary circle having a radius of 2 μm, this case is outside the scope of the present invention.

The thread-shaped or starfish-shaped or web-shaped structure observed in the polished surface also exists in the thickness direction of the target as a matter of course. Like this, since the starfish-shaped or web-shaped structure bonded in the thickness direction of the target will hardly cause grain separation, it could be said that these are even more preferable. An increase in the contact area of the starfish-shaped or web-shaped particles and the ferromagnetic material to become the matrix is effective in preventing grain separation. Thus, it could be said that the width of the thread-shape or starfish-shape or web-shape is preferably small and dispersed.

Figure 4:
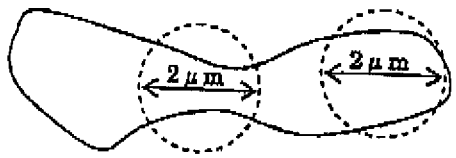
FIG. 4 is a view showing a frame format of gourd-shaped particles.

As another shape, gourd-shaped particles may also be considered. FIG. 4 is a view showing a frame format of such gourd-shaped particles. In this case, although the constricted part will not be a particular problem, the bulged portion needs to have a radius of 2.0 μm or less. In this respect, gourd-shaped particles are the same as spherical particles.

A sputtering target of the present invention made of a ferromagnetic material containing a dispersion of particles of a nonmagnetic material preferably has, a microstructure observed on a polished face of the sputtering target, areas of the ferromagnetic material phase in which the particles of the nonmagnetic material phase do not exis, a largest diameter of diameters of said areas being 40 μm or less, and a number of said areas having a diameter of 10 μm or greater being 1000 areas/mm$^2$ or less. This recited feature of the microstructure of the target means that the ferromagnetic material is desirably not concentrated in only a certain area of the target microstructure in order to obtain a uniform dispersion of the nonmagnetic material in the target microstructure.

As a result of the above, the nonmagnetic material particle dispersed ferromagnetic material sputtering target of the present invention is able to achieve a relative density or 97% or higher, and even a relative density of 98% or higher.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

As sintering raw material powder, a magnetic material of Co fine powder, Cr fine powder, and Pt fine powder respectively having a grain size that is less than 5 μm was used, and at the same time SiO powder having an average grain size of 1 μm was used. This was weighed to achieve 94(74Co-10Cr-16Pt)-6SiO$_2$ (mol %), and mixed in a wet ball mill for 100 hours. Subsequently, the mixed powder was filled in a carbon mold, and sintered with the hot press method at 1200° C. for 1 hour to obtain a ferromagnetic body material target composed of 94(74Co-10Cr-16Pt)-6SiO$_2$.

Figure 5:
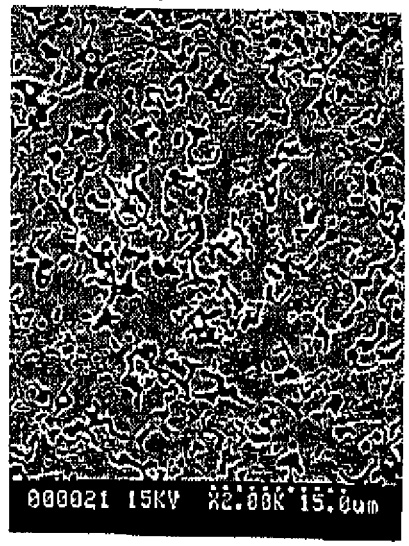
FIG. 5 is an SEM image of a target polished face obtained in Example 1.

The relative density of this target was 98%, and a high density target was obtained. The results are shown in Table 1. The SEM image of the polished face of the target is shown in FIG. 5. As shown in FIG. 5, thin thread-shaped fine SiO$_2$ particles were dispersed therein.

The distance from an arbitrary point in the SiO$_2$ particles as the nonmagnetic material to the interface upon drawing a perpendicular line toward the interface in this case was within the range of 1 μm or less. In other words, the condition of the present invention in which the shape and size are smaller than all imaginary circles having a radius of 1 μm formed around an arbitrary point within the nonmagnetic material particles, or alternatively the shape and size with at least two contact points or intersection points between the imaginary circles and the interface of the ferromagnetic material and the nonmagnetic material was satisfied.

In a material including nonmagnetic material SiO$_2$ particles dispersed in a ferromagnetic material composed from Co—Cr—Pt, in a portion of an area in which SiO$_2$ particles observed in the polished face do not exist; that is, an area with only the ferromagnetic material having a diameter of 10 μm or greater less, there were 32 particles/mm$^2$. The results are shown in Table 1. This particle count is extremely small, and it has been confirmed that a target with no segregation and superior uniformity could be obtained.

The obtained material was processed into a 6-inch f size target, and this target was used in sputtering. The sputtering conditions were DC sputtering, sputtering power of 1000 W, Ar gas pressure of 0.5 Pa, and a target film thickness of 500 Å for the deposition. The status concerning the generation of particles is shown in Table 1. As evident from Table 1, the generation of particles was extremely low.

TABLE 1

| | Relative Density | Number of Particles Existing in Portions with Diameter of 10 μm or Greater (Particles/mm$^2$) | Number of Generated Particles |
|---|---|---|---|
| Example 1 | 98% | 18 particles | 22 particles |
| Example 2 | 98% | 32 particles | 31 particles |
| Example 3 | 98% | 20 particles | 40 particles |
| Comparative Example 1 | 97% | 300 particles | 300 particles |
| Comparative Example 2 | 96% | 3000 particles or more | >3000 particles |

Example 2

As sintering raw material powder, a magnetic material of Co fine powder, Cr fine powder, and Pt fine powder respectively having a grain size that is less than 5 μm was used, and at the same time Ta$_2$O$_5$ powder having an average grain size of 1 μm was used. This was weighed to achieve 97(74Co-10Cr-16Pt)-3Ta$_2$O$_5$ (mol %), and mixed in a ball mill for 60 hours. Subsequently, the mixed powder was filled in a carbon mold, and sintered with the hot press method at 1200° C.; for 1 hour to obtain a ferromagnetic body material target composed of 97(74Co-10Cr-16Pt)-3Ta$_2$O$_5$ (mol %).

Figure 6:
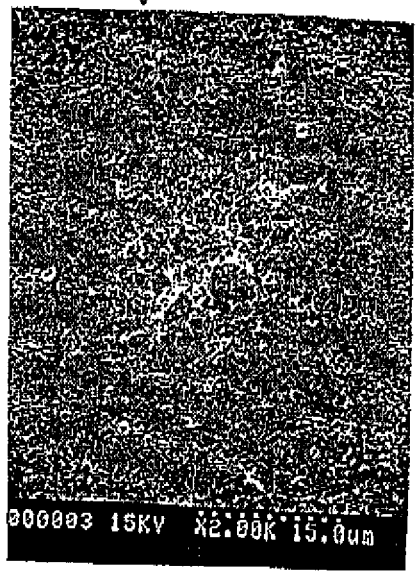
FIG. 6 is an SEM image of a target polished face obtained in Example 2.

The relative density of this target was 98%, and a high density target was obtained. The results are shown in Table 1. The SEM image of the polished face of the target is shown in FIG. 6. As shown in FIG. 6, simulated spherical fine Ta$_2$O$_5$ particles were dispersed therein.

The distance from an arbitrary point in the Ta$_2$O$_5$ particles as the nonmagnetic material to the interface upon drawing a perpendicular line toward the interface in this case was within the range of 2 μm or less. In other words, the condition of the present invention in which the shape and size are smaller than all imaginary circles having a radius of 2 μm formed around an arbitrary point within the nonmagnetic material particles, or alternatively the shape and size with at least two contact points or intersection points between the imaginary circles and the interface of the ferromagnetic material and the nonmagnetic material was satisfied.

In a material including nonmagnetic material Ta$_2$O$_5$ particles dispersed in a ferromagnetic material composed from Co—Cr—Pt, in a portion of an area in which Ta$_2$O$_5$ particles observed in the polished face do not exist; that is, an area with only the ferromagnetic material having a diameter of 10 μm or greater less, there were 19 particles/mm$^2$. The results are shown in Table 1. This particle count is extremely small, and it has been confirmed that a target with no segregation and superior uniformity could be obtained.

The obtained material was processed into a 6-inch f size target, and this target was used in sputtering. The sputtering conditions were DC sputtering, sputtering power of 1000 W, Ar gas pressure of 0.5 Pa, and a target film thickness of 500 Å for the deposition. The status concerning the generation of particles is shown in Table 1. As evident from Table 1, the generation of particles was extremely low.

Example 3

As sintering raw material powder, a magnetic material of Co fine powder, Cr fine powder, and Pt fine powder respectively having a grain size that is less than 5 μm was used, and at the same time commercially available Cr$_2$O$_3$ powder having an average grain size of 1 μm was used. This was weighed to achieve 94(74Co-10Cr-16Pt)-8 Cr$_2$O$_3$ (mol %), and mixed in a ball mill for 100 hours. Subsequently, the mixed powder was filled in a carbon mold, and sintered with the hot press method at 1200° C. for 1 hour to obtain a ferromagnetic body material target composed of 94(74Co-10Cr-16Pt)-8Cr$_2$O$_3$ (mol %).

Figure 7:
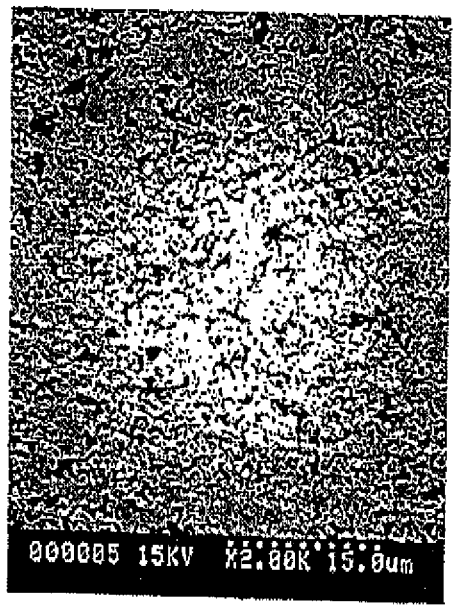
FIG. 7 is an SEM image of a target polished face obtained in Example 3.

The relative density of this target was 98%, and a high density target was obtained. The results are shown in Table 1. The SEM image of the polished face of the target is shown in FIG. 7. As shown in FIG. 7, thin thread-shaped fine Cr$_2$O$_3$ particles were dispersed therein.

The distance from an arbitrary point in the Cr$_2$O$_3$ particles as the nonmagnetic material to the interface upon drawing a perpendicular line toward the interface in this case was within the range of 2 μm or less. In other words, the condition of the present invention in which the shape and size are smaller than all imaginary circles having a radius of 2 μm formed around an arbitrary point within the nonmagnetic material particles, or alternatively the shape and size with at least two contact points or intersection points between the imaginary circles and the interface of the ferromagnetic material and the nonmagnetic material was satisfied.

In a material including nonmagnetic material $Cr_2O_3$ particles dispersed in a ferromagnetic material composed from Co—Cr—Pt, in a portion of an area in which $Cr_2O_3$ particles observed in the polished face do not exist; that is, an area with only the ferromagnetic material having a diameter of 10 μm or greater less, there were 20 particles/mm². The results are shown in Table 1. This particle count is extremely small, and it has been confirmed that a target with no segregation and superior uniformity could be obtained.

The obtained material was processed into a 6-inch f size target, and this target was used in sputtering. The sputtering conditions were DC sputtering, sputtering power of 1000 W, Ar gas pressure of 0.5 Pa, and a target film thickness of 500 Å for the deposition. The status concerning the generation of particles is shown in Table 1. As evident from Table 1' the generation of particles was extremely low.

Comparative Example 1

As sintering raw material powder, a magnetic material of Co fine powder, Cr fine powder, and Pt fine powder respectively having a grain size that is less than 5 μm was used, and at the same time $SiO_2$ powder having an average grain size of 1 μm was used. This was weighed to achieve 94(74Co-10Cr-16Pt)-6$SiO_2$ (mol %), and mixed in a ball mill for 10 hours. Subsequently, the mixed powder was filled in a carbon mold, and sintered with the hot press method at 1200° C. for 1 hour to obtain a ferromagnetic body material target composed of 94(74Co-10Cr-6Pt)-6$SiO_2$.

Figure 8:
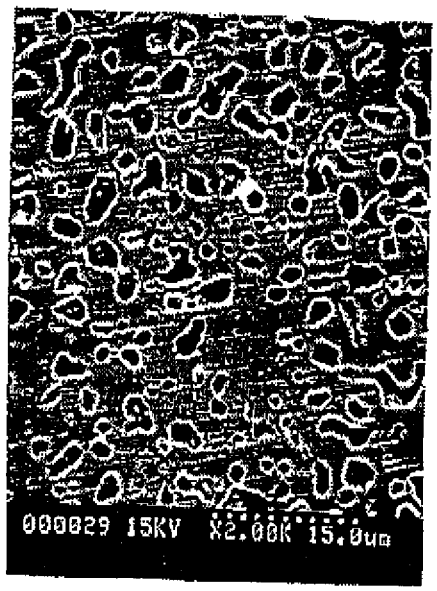
FIG. 8 is an SEM image of a target polished face obtained in Comparative Example 1.

The relative density of this target was 97%, and a relatively high density target was obtained. The results are shown in Table 1. The SEM image of the polished face of the target is shown in FIG. 8. As shown in FIG. 8, simulated spherical coarse $SiO_2$ particles having an average grain size (diameter) of 5 to 8 μm were dispersed therein.

When drawing an imaginary circle having a radius of 1 μm from an arbitrary point in the ferromagnetic body material and the $SiO_2$ particles as the nonmagnetic material, the imaginary circle was included in inside the particles, and there were many particles in without a contact point or an intersection point with the interface.

In a material including nonmagnetic material $SiO_2$ particles dispersed in a ferromagnetic material composed from Co—Cr—Pt, in a portion of an area in which $SiO_2$ particles observed in the polished face do not exist; that is, an area with only the ferromagnetic material having a diameter of 10 μm or greater less, there were 300 particles/mm². The results are shown in Table 1. This particle count is extremely large in comparison to the Examples, and a target with significant segregation and inferior uniformity was obtained.

The obtained material was processed into a 6-inch f size target, and this target was used in sputtering. The sputtering conditions were DC sputtering, sputtering power of 1000 W, and Ar gas pressure of 0.5 Pa. The target, however, showed considerable abnormal discharge, and the particle count was roughly 300 particles.

Comparative Example 2

As metallic raw material powder, 74Co-10Cr-16Pt atomized powder (alloy powder) and $SiO_2$ powder having an average grain size of 1 μm were used. This was weighed to achieve 94(74Co-10Cr-16Pt)-6$SiO_2$ (mol %), and mixed in a ball mill for 100 hours. Subsequently, the mixed powder was filled in a carbon mold, and sintered with the hot press method at 1200° C. for 1 hour to obtain a ferromagnetic body material target composed of 94(74Co-10Cr-16Pt)-6$SiO_2$.

Figure 9:
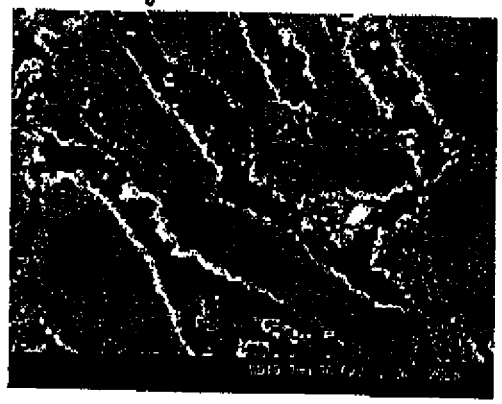
FIG. 9 is an SEM image of a target polished face obtained in Comparative Example 2.

The relative density of this target was 96%, and a relatively high density target was obtained. The results are shown in Table 1. The SEM image of the polished face of the target is shown in FIG. 9. As shown in FIG. 9, there was a layer in which $SiO_2$ particles were dispersed in the grain boundary of extremely large ferromagnetic material particles.

The length of the perpendicular line drawn from an arbitrary point in the ferromagnetic body material and the $SiO_2$ particles as the nonmagnetic material toward the interface direction in this case was within the range of 15 to 30 μm.

When drawing an imaginary circle having a radius of 2 μm from an arbitrary point in the nonmagnetic material particles, there were few particles with a contact point or an intersection point between the imaginary circle and the interface, and most of the circle was included inside particles. This did not satisfy the condition of the present invention.

In a material including nonmagnetic material $SiO_2$ particles dispersed in a ferromagnetic material composed from Co—Cr—Pt, in a portion of an area in which $SiO_2$ particles observed in the polished face do not exist; that is, an area with only the ferromagnetic material having a diameter of 10 μm or greater less, there were 3000 particles/mm² or more. The results are shown in Table 1. This particle count is extremely large in comparison to the Examples, and a target with significant segregation and inferior uniformity was obtained.

The obtained material was processed into a 6-inch f size target, and this target was used in sputtering. The sputtering conditions were DC sputtering, sputtering power of 1000 W, and Ar gas pressure of 0.5 Pa. The target, however, shown considerable abnormal discharge, and the particle count exceeded 3000 particles, which is the upper limit of measurement.

The present invention provides stable DC sputtering by subjecting nonmagnetic materials to high dispersion and densifying the relative density to be 98% or higher. Consequently, the present invention yields a superior effect of being able to facilitate the controllability of sputtering, which is a characteristic of DC sputtering, increase the deposition speed, achieve uniform deposition, and improve the sputtering efficiency. In addition, the present invention also yields a superior effect of being able to reduce the particles (dust) and nodules that are generated during sputtering upon performing deposition, improve the mass productivity with minimal variation in quality, and produce such a sputtering target at low cost.

Accordingly, the present invention can be favorably used as a high density nonmagnetic material particle dispersed ferromagnetic material sputtering target, and in particular as a magnetic recording layer.

The invention claimed is:

1. A sputtering target of a ferromagnetic material containing a dispersion of particles of a nonmagnetic material and capable of use in DC magnetron sputtering, comprising a sintered compact sputtering target consisting of the ferromagnetic material and the dispersed particles of the nonmagnetic material, the nonmagnetic material being one or more materials selected from a group consisting of an oxide, nitride, carbide, and silicide, wherein each of the particles of the nonmagnetic material existing in a microstructure on a polished face of the sputtering target has a size that cannot encompass any imaginary circle which has a radius of 2 μm and which has a center at an arbitrary point within a periphery of the particle, or alternatively a size such that the imaginary circle has at least two contact points or intersection points with the periphery of the particle, and wherein, in the microstructure on the polished face of the sputtering target, a largest diameter of diameters of areas containing no particles of the nonmagnetic material is 40 μm or less.

2. A sputtering target according to claim 1, wherein the imaginary circle has a radius of 1 μm.

3. A sputtering target according claim 2, wherein, in the microstructure on the polished face of the sputtering target, the number of said areas containing no particles of nonmagnetic material having a diameter of 10 to 40 μm is 1000 areas/mm² or less.

4. A sputtering target according to claim 3, wherein the ferromagnetic material is a material having Co and/or Fe as its main component.

5. A sputtering target according to claim 4, wherein the nonmagnetic material is composed of at least one metallic oxide which is not reduced or decomposed by heating in the presence of metallic Co or metallic Cr or the mixture or alloy thereof in a vacuum or inert atmosphere.

6. A sputtering target according to claim 5, wherein the metallic oxide is an oxide of a metal selected from a group consisting of Cr, Ta, V, Si, Ce, Ti, Zr, Al, Mg, and Nb.

7. A sputtering target according claim 1, wherein, in the microstructure on the polished face of the sputtering target, the number of areas containing no particles of nonmagnetic material having a diameter of 10 to 40 μm is 1000 areas/mm² or less.

8. A sputtering target according to claim 7, wherein the ferromagnetic material is a material having Co and/or Fe as its main component.

9. A sputtering target according to claim 8, wherein the nonmagnetic material is composed of at least one metallic oxide which is not reduced or decomposed by heating in the presence of metallic Co or metallic Cr or the mixture or alloy thereof in a vacuum or inert atmosphere.

10. A sputtering target according to claim 9, wherein the metallic oxide is an oxide of a metal selected from a group consisting of Cr, Ta, V, Si, Ce, Ti, Zr, Al, Mg, and Nb.

11. A sputtering target according to claim 1, wherein the ferromagnetic material is a material having Co and/or Fe as its main component.

12. A sputtering target according to claim 11, wherein the nonmagnetic material is composed of at least one metallic oxide which is not reduced or decomposed by heating in the presence of metallic Co or metallic Cr or the mixture or alloy thereof in a vacuum or inert atmosphere.

13. A sputtering target according to claim 1, wherein the nonmagnetic material is composed of at least one metallic oxide which is not reduced or decomposed by heating in the presence of metallic Co or metallic Cr or the mixture or alloy thereof in a vacuum or inert atmosphere.

14. A sputtering target according to claim 13, wherein the metallic oxide is an oxide of a metal selected from a group consisting of Cr, Ta, V, Si, Ce, Ti, Zr, Al, Mg, and Nb.

15. A sputtering target according to claim 1, wherein the nonmagnetic material is selected from the group consisting of a nitride, carbide, and silicide.

16. A sputtering target according to claim 1, wherein the nonmagnetic material is selected from the group consisting of a nitride, and carbide.

17. A sputtering target according to claim 1, wherein the ferromagnetic material is a material having Fe as its main component.

* * * * *